(12) United States Patent
Miller et al.

(10) Patent No.: US 7,290,084 B2
(45) Date of Patent: Oct. 30, 2007

(54) FAST COLLISION DETECTION FOR A HASHED CONTENT ADDRESSABLE MEMORY (CAM) USING A RANDOM ACCESS MEMORY

(75) Inventors: Michael J. Miller, Saratoga, CA (US); David A. Honig, Irvine, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 198 days.

(21) Appl. No.: 10/980,858

(22) Filed: Nov. 2, 2004

(65) Prior Publication Data

US 2006/0095654 A1    May 4, 2006

(51) Int. Cl.
*G06F 12/00* (2006.01)

(52) U.S. Cl. .................. 711/108; 711/216; 711/219

(58) Field of Classification Search ................ 711/210, 711/216
See application file for complete search history.

(56) References Cited

U.S. PATENT DOCUMENTS

| | | | |
|---|---|---|---|
| 4,056,845 A | 11/1977 | Churchill, Jr. | |
| 5,339,398 A | 8/1994 | Shah et al. | |
| 5,920,900 A | 7/1999 | Poole et al. | |
| 5,930,359 A | 7/1999 | Kempke et al. | |
| 6,226,710 B1 | 5/2001 | Melchior | |
| 6,622,168 B1 | 9/2003 | Datta | |
| 6,697,276 B1 | 2/2004 | Pereira et al. | |
| 6,708,250 B2 | 3/2004 | Gillingham | |
| 6,735,670 B1 * | 5/2004 | Bronstein et al. | 711/108 |
| 6,748,484 B1 | 6/2004 | Henderson et al. | |
| 6,754,800 B2 | 6/2004 | Wong et al. | |
| 6,763,426 B1 | 7/2004 | James et al. | |
| 6,889,225 B2 | 5/2005 | Cheng et al. | |
| 6,892,237 B1 | 5/2005 | Gai et al. | |
| 6,934,796 B1 * | 8/2005 | Pereira et al. | 711/108 |
| 7,116,664 B2 * | 10/2006 | Davis et al. | 370/392 |
| 2002/0094084 A1 | 7/2002 | Wasilewski et al. | |
| 2002/0161969 A1 | 10/2002 | Nataraj et al. | |
| 2002/0178341 A1 | 11/2002 | Frank | |
| 2003/0188089 A1 | 10/2003 | Perloff | |
| 2003/0210689 A1 * | 11/2003 | Davis et al. | 370/389 |

OTHER PUBLICATIONS

"IPv4," http://en.wikipedia.org/wiki/IPv4, pp. 1-4.
"IPv6," http://en.wikipedia.org/wiki/IPv6, pp. 1-9.
Fielding et al., "Hypertext Transfer Protocol," published 1999, p. 25.
IBM Tech. Disc. Bulletin, "Improved Caching on Net Commerce Pages," published May 2001, Issue 445, p. 863.

* cited by examiner

*Primary Examiner*—Jack Lane
(74) *Attorney, Agent, or Firm*—Bever, Hoffman & Harms

(57) ABSTRACT

A hardware hashing circuit is configured to perform a hashing function on a received character string, thereby creating a hashed output value and a collision resolution value. A content addressable memory (CAM) receives the hashed output value, and in response, provides an index value and activates a hit signal if the hashed output value matches an entry of the CAM. A random access memory (RAM) receives the index value from the CAM. The RAM stores a collision resolution value and information associated with the character string in an entry associated with the index value. The RAM provides this information and collision resolution value in response to the index value. Logic circuitry indicates a collision if the hit signal is activated and the collision resolution value provided by the hardware hashing circuit does not match the collision resolution value provided by the RAM.

35 Claims, 9 Drawing Sheets

FAST COLLISION DETECTION FOR A HASHED CONTENT ADDRESSABLE MEMORY (CAM) USING A RANDOM ACCESS MEMORY

RELATED APPLICATIONS

The present application is related to U.S. patent application Ser. No. 10/173,516 filed Jun. 14, 2002, by David A. Honig, entitled "Hardware Hashing of an Input of a Content Addressable Memory (CAM) to Emulate a Wider CAM". The present application is also related to U.S. patent application Ser. No. 10/173,206 filed Jun. 14, 2002, by David A. Honig, entitled "Use of Hashed Content Addressable Memory (CAM) to Accelerate Content-Aware Searches".

BACKGROUND OF THE INVENTION

1. Field of the Invention

The present invention relates to a method and apparatus for reducing the frequency of collisions in a hashed content addressable memory (CAM) array.

2. Related Art

A hashing function irreversibly reduces a relatively wide data value to a relatively narrow data value. Advantageously, the narrow data value can then be processed more easily than the wide data value. For example, the narrow data value can be used to access information associated with the wide data value. However, the nature of a hashing function can result in collisions. A collision occurs when two different wide data values are hashed down to the same narrow data value. To resolve collisions, a system must store the wide data values, and determine when two of the wide data values hash to the same narrow data value. Upon detecting a collision, the system must then have a process for resolving the collision. In one process, the wide data values are stored, and subsequently searched during a collision. One conventional search method is to search data organized in a binary tree in a serial manner. However, such a search method is relatively slow. Another conventional search method is to search using a content addressable memory (CAM) array. However, CAM arrays typically have a relatively small width, and are unable to accommodate searches of wide data values in an efficient manner. Organizing, storing and searching these wide data values is time consuming when performed by a system processor.

FIG. 1 is a block diagram of a conventional system 100 used to process wide data values. System 100 includes hashing function 101, multiplexer 102, registers 103-105, comparator 107 and random access memory (RAM) routing table 110. Hashing function 101 is configured to receive a relatively wide (e.g., 256-bit) data value, KEY. Hash function 101 provides a relatively narrow (e.g., 20-bit) hashed value (H_VALUE) in response to the KEY value. As described above, it is possible for hashing function 101 to provide the same H_VALUE in response to different KEY values. In the present example, the KEY values "ZZZ", "YYZ" and "ABC" all hash to the same H_VALUE, "AA".

The KEY values "ZZZ", "YYZ" and "ABC" are stored in RAM 110 in a chained manner. Thus, KEY value "ZZZ", which is selected as the first value in the chain, is stored at address location "AA" of RAM 110. Also stored in address location "AA" are: (1) the address of the next KEY value in the chain (i.e., address "BB"), and (2) information (i.e., "MMM"), such as routing data, associated with the KEY value "ZZZ".

The KEY value "YYZ", which is selected as the second value in the chain, is stored at address location "BB" of RAM 110. Also stored in address location "BB" are:
(1) the address of the next KEY value in the chain (i.e., "CC") and (2) information (i.e., "NNN") associated with the KEY value "YYZ".

The KEY value "ABC", which is the last value in the chain, is stored at address location "CC" of RAM 110. Also stored in address location "CC" is the information (i.e., "PPP") associated with the KEY value "ABC".

System 100 operates as follows. Hashing function 101 provides an H_VALUE of "AA" when a KEY value of "ABC" is provided to hashing function 101. Multiplexer 102 is configured to provide this H_VALUE to register 103. Register 103 stores this H_VALUE, which is provided to RAM 110 as an address value (ADDR). In response, RAM 110 accesses the entry stored at address "AA". Thus, the next address value associated with this entry (i.e., "BB") is loaded into register 104, and the key value associated with this entry (i.e., "ZZZ") is loaded into register 105. Comparator 107 compares the contents of register 105 ("ZZZ") with the original KEY value ("ABC") and determines that there is no match (i.e., HIT=0). In response, multiplexer 102 is configured to route the address value "BB" stored in register 104.

This address value "BB" is loaded into register 103, and provided to RAM 110. In response, RAM 110 accesses the entry stored at address "BB". The next address value associated with this entry (i.e., "CC") is loaded into register 104, and the key value associated with this entry (i.e., "YYZ") is loaded into register 105. Comparator 107 then compares the contents of register 105 ("YYZ") with the original KEY value ("ABC") and determines that there is no match. In response, multiplexer 102 is configured to route the next address value "CC" stored in register 104.

This address value "CC" is loaded into register 103, and provided to RAM 110. In response, RAM 110 accesses the entry stored at address "CC". The next address value associated with this entry (i.e., "--") is loaded into register 104, and the key value associated with this entry (i.e., "ABC") is loaded into register 105.

Comparator 107 compares the contents of register 105 ("ABC") with the original KEY value ("ABC") and determines that a match exists (i.e., HIT=1). In response, system 100 provides the proper data value associated with this match (i.e., "PPP") as the output data value, DATA.

In the foregoing manner, system 100 sequentially checks every entry in the chain until detecting a matching KEY value. The time required to process a KEY value will therefore vary, depending upon where a match is detected in the chain. Within system 100, the probability of two KEY values hashing to the same H_VALUE is initially about $1:2^{20}$. This probability increases as the RAM routing table 110 is filled.

It would therefore be desirable to have an improved process for reducing the frequency of collisions in a system that hashes wide data values to narrow data values, thereby reducing the number of times that the wide data values must be processed using inefficient processing schemes, such as the one implemented by system 100. It would further be desirable if such an improved process can be implemented with relatively few additional hardware requirements.

SUMMARY

Accordingly, the present invention provides a system that processes relatively wide input data values having associated information in the following manner. First, a wide input data value must be added to the system. To accomplish this, the wide input data value is stored in a network processing unit, and provided to a hardware hashing circuit. The hardware hashing circuit provides a relatively narrow hashed output value and a collision resolution value in response to the wide input data value. The hashed output value is stored in an entry of a CAM array. This entry of the CAM array is associated with an entry of a random access memory. More specifically, when this entry of the CAM array exhibits a match during a compare operation, the CAM array provides an index signal that points to the associated entry of the random access memory. The associated entry of the random access memory is programmed to store both the collision resolution value provided by the hardware hashing circuit, and the information associated with the wide input data value. In one embodiment, the hashed output value has a width equal to the width of the CAM array.

The information associated with the wide input data value can then be retrieved as follows. The network processing unit provides the wide input data value to the hardware hashing circuit. Again, the hardware hashing circuit provides the hashed output value and the collision resolution value in response to the wide input data value. The hashed output value is compared with the contents of the CAM array. Because this hashed output value was previously stored in the CAM array, a match exists. As a result, the CAM array provides the associated index value to the random access memory, thereby causing the random access memory to retrieve the previously stored collision resolution value and the associated information. The CAM array also activates a hit control signal that indicates that a match was detected.

A comparator is provided to compare the collision resolution value provided by the hardware hashing circuit with the collision resolution value retrieved from the random access memory. If a match does not exist, the comparator activates a NOT_EQUAL control signal. If the NOT_EQUAL signal and the hit control signal are both activated, a collision control signal is activated, thereby indicating that a collision exists. The activated collision control signal is provided to the network processing unit. In response, the network processing unit processes the wide input data value in a conventional manner, such as that described above in connection with system 100.

However, if the comparator determines that the collision resolution value provided by the hardware hashing circuit matches the collision resolution value retrieved from the random access memory, then the NOT_EQUAL control signal is not activated. As a result, the collision control signal is not activated. Under these conditions, the network processing unit uses the information provided by the random access memory to further process (e.g., route) the wide input data value.

In the foregoing manner, the present invention uses the collision resolution value to reduce the frequency of collisions. Thus, even if two different wide input data values hash to the same hashed output value, it is unlikely that these wide input data values will also hash to the same collision resolution value. As long as different wide input data values do not hash to the same collision resolution value, the system will recognize these different wide input data values.

In one embodiment, the system further includes means for configuring the hardware hashing circuit to process wide input data values having different widths. In a particular embodiment, the hardware hashing circuit comprises a plurality of Data Encryption Standard (DES) circuits, which are selectively coupled to receive the wide input data values in response to the configuration bits. The DES circuits provide hashed values, which are selectively provided to exclusive OR circuits in response to the configuration bits. The exclusive OR circuits combine the hashed values provided by the DES circuits, thereby providing the hashed output value and the collision resolution value.

In another variation, the present invention provides a system that processes relatively wide input data values having associated information in the following manner. Initially, a first wide input data value is added to the system. To accomplish this, the first wide input data value is stored in a network processing unit, and provided to a hardware hashing circuit. The hardware hashing circuit provides a first hashed output value in response to the first wide input data value. This first hashed output value is compared with the entries of a CAM array. Initially, no match exists, and the CAM array de-activates a HIT control signal (thereby indicating that no match exists) and provides an associated first index signal. A collision logic circuit de-activates a collision resolution value in response to the de-activated HIT signal. The de-activated collision resolution value and the information associated with the first wide input data value are stored in an first entry of a random access memory, associated with the first index signal.

Subsequently, when the first wide input data value is provided to the system, the de-activated collision resolution value and the associated information are retrieved from the random access memory, with the de-activated collision resolution value indicating that the associated information is valid.

Additional wide input data values are added to the system in a similar manner. However, when a subsequent wide input data value hashes to the same hashed output value as a previously processed wide input data value, the processing must be modified.

For example, if a second wide input data value causes the hardware hashing circuit to provide the first hashed output value, a collision exists. The first hashed output value is compared with the entries of a CAM array. A match exists, because the first hashed output value was previously stored in the CAM array. In response, the CAM array activates the HIT control signal (thereby indicating that a match exists) and provides the associated first index signal. The collision logic circuit activates the collision resolution value in response to the activated HIT signal. The activated collision resolution value is stored in the first entry of a random access memory, thereby overwriting the previously stored de-activated collision resolution value.

Whenever the first or second wide input data value is subsequently applied to the system, the activated collision resolution value and the associated information is retrieved from the first entry of the random access memory and provided to the network processing unit. This activated collision resolution value indicates that a collision exists, and that the associated information retrieved from the random access memory is invalid. In response, the network processing unit processes the first or second wide input data value using a conventional process.

The present invention will be more fully understood in view of the following description and drawings.

DETAILED DESCRIPTION

Figure 2:
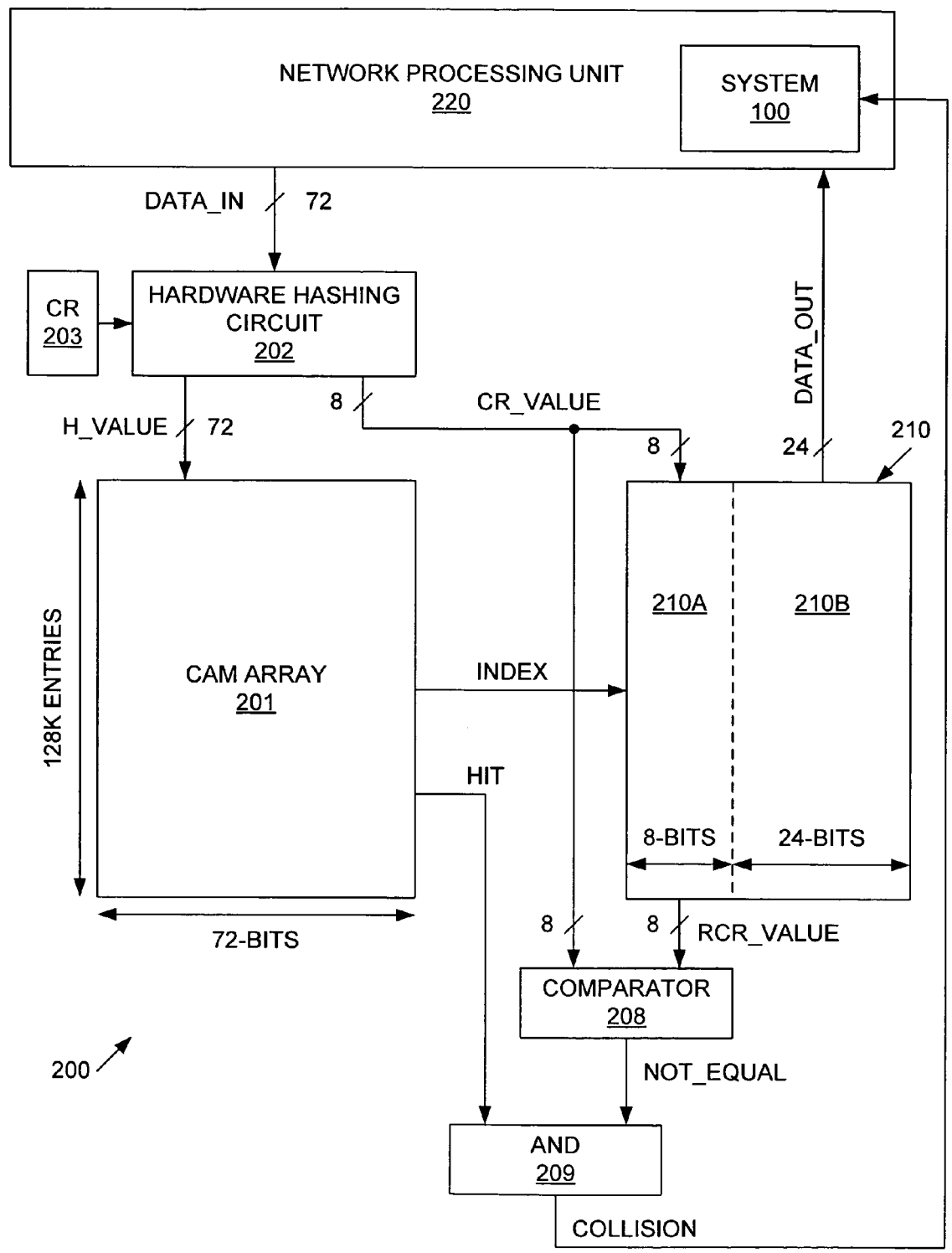
FIG. 2 is a block diagram of a system that includes a hardware hashing circuit, a CAM array, a random access memory (RAM), a comparator, a logical AND gate, and a network processing unit (NPU), in accordance with one embodiment of the present invention.

FIG. 2 is a block diagram of a system 200 that includes CAM array 201, hardware hashing circuit 202, configuration register 203, comparator 208, AND gate 209, random access memory (RAM) 210 and network processing unit (NPU) 220, in accordance with one embodiment of the present invention. In one embodiment, CAM array 201, hardware hashing circuit 202, and configuration register 203, are located on the same chip, although this is not necessary. In the described embodiment, CAM array 201 is a conventional binary CAM array having a width of 72-bits and a depth of 128K entries. Also in the described embodiment, RAM 210 is a conventional SRAM array having a width of 32-bits.

In the described embodiment, system 200 is capable of processing input data values (DATA_IN) having various widths, including 288-bits or 576-bits, by hashing these input data values to 72-bit hashed input values (H_VALUE). However, other widths can be accommodated in other embodiments.

In general, hashing is the transformation of a wide data value into a shorter fixed-length value that represents the original wide data value. In accordance with the described embodiments, hashing is used to transform the relatively wide input data value DATA_IN to a relatively narrow, hashed input value H_VALUE. In the described embodiment, the hashed input value H_VALUE has a fixed length of 72-bits, which corresponds with the width of CAM array 201. In accordance with present invention, hashing is also used to transform the input data value DATA_IN to a relatively narrow collision resolution value CR_VALUE, which is largely independent of the hashed input value H_VALUE. In the described embodiment, the collision resolution value CR_VALUE has a fixed length of 8-bits. It is understood that the hashed input value H_VALUE and the collision resolution value CR_VALUE can have other widths in other embodiments.

Configuration register 203 is programmed to store one or more configuration bits, which are used to determine which one of a plurality of data value widths is currently being implemented by system 200. Configuration register 203 provides these configuration bits to hardware hashing circuit 202 on a configuration bus. In response, hardware hashing circuit 202 is configured in an appropriate configuration, as described in more detail below. In an alternate embodiment, the configuration bits are provided to hardware hashing circuit 202 by NPU 220, thereby rendering configuration register 203 unnecessary.

In the described embodiment, when configuration register 203 stores configuration bits having a value of "01", then hardware hashing circuit 202 is configured to process input data values having a width of 576-bits. When configuration register 203 stores configuration bits having a value of "10", then hardware hashing circuit 202 is configured to process input data values having a width of 288-bits. In the described embodiments, each input data value is provided as a plurality of 72-bit input data values (DATA_IN), although this is not necessary. Thus, an input data value having a width of 576-bits is provided as eight 72-bit input data values, and an input data value having a width of 288-bits is provided as four 72-bit input data values. As described in more detail below, the 72-bit input data values are loaded into a wide register in hardware hashing circuit 202. Hardware hashing circuit 202 then performs a hashing operation on the 288-bit or 576-bit input data value, thereby creating a 72-bit hashed input value (H_VALUE), which is applied to CAM array 201. Hardware hashing circuit 202 also creates an 8-bit collision resolution value (CR_VALUE), which is applied to RAM 210 and comparator 208.

Figure 3:
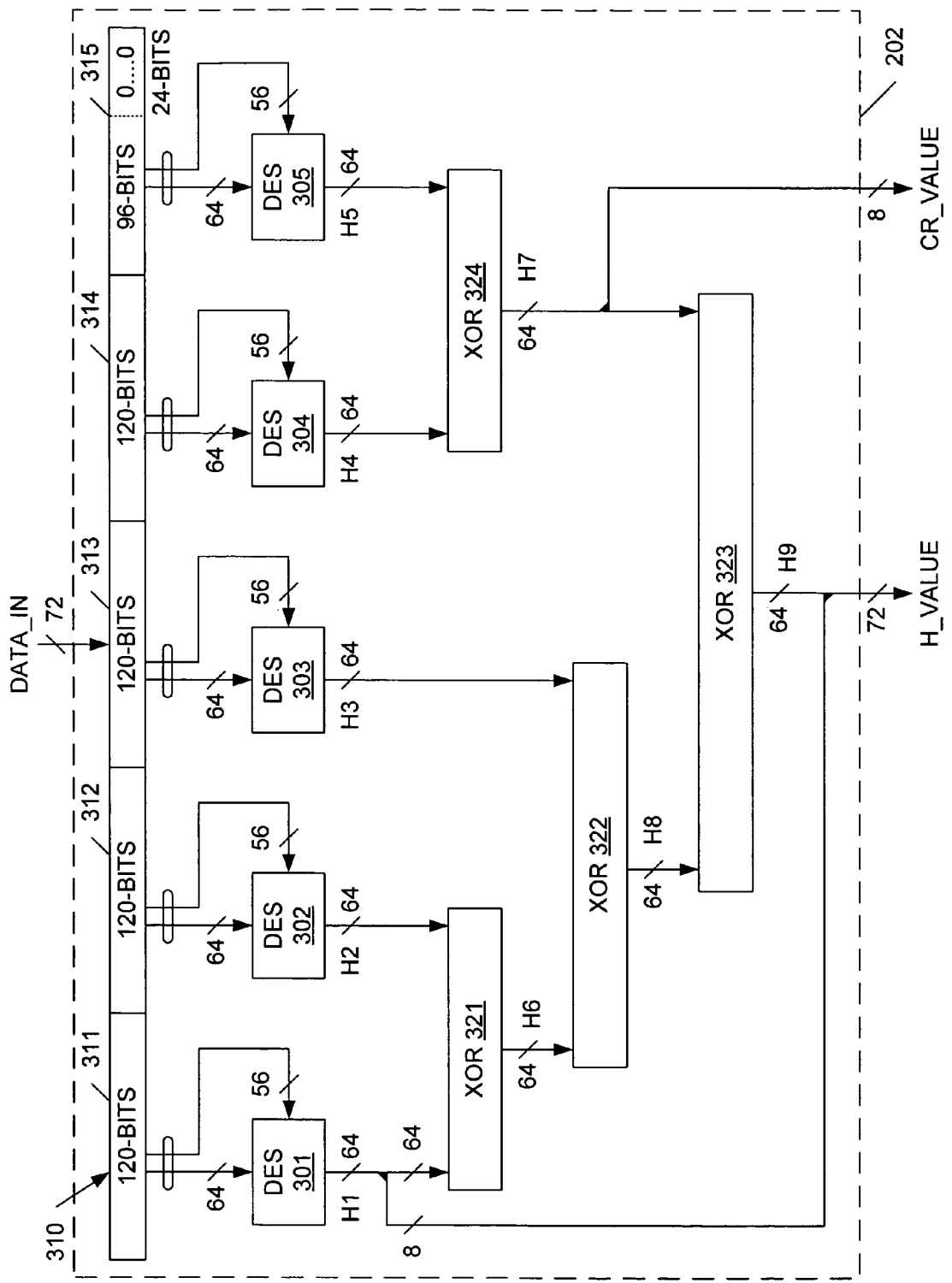
FIG. 3 is a block diagram of a hardware hashing circuit located on the IC chip of FIG. 2, configured to receive a 576-bit input data value, in accordance with one embodiment of the present invention.

FIG. 3 is a block diagram of hardware hashing circuit 202, configured to receive a 576-bit input data value, in accordance with one embodiment of the present invention (i.e., configuration bits have a value of "01"). Hardware hashing circuit 202 includes Data Encryption Standard (DES) blocks 301-305, input register 310, and exclusive OR blocks 311-314. Input register 310 includes five smaller registers 311-315, each having a width of 120-bits. Eight consecutive 72-bit DATA_IN values are loaded (e.g., shifted) into input register 310 in the 576-bit configuration of FIG. 3. In the described embodiment, the first 72-bit DATA_IN value is loaded into bit locations [119:48] of register 311; the second 72-bit DATA_IN value is loaded into bit locations [47:0] of register 311 and bit locations [119:96] of register 312; the third 72-bit DATA_IN value is loaded into bit locations [95:24] of register 312; the fourth 72-bit DATA_IN value is loaded into bit locations [23:0] of register 312 and bit locations [119:72] of register 313; the fifth 72-bit DATA_IN value is loaded into bit locations [71:0] of register 313; the sixth 72-bit DATA_IN value is loaded into bit locations [119:48] of register 314; the seventh 72-bit DATA_IN value is loaded into bit locations [47:0] of register 314 and bit locations [119:96] of register 315; and the eighth 72-bit DATA_IN value is loaded into bit locations [95:24] of register 312. Bit locations [23:0] of register 315 are loaded with logic "0" values. In other embodiments, the eight 72-bit DATA_IN values and 24 logic "0" values can be loaded into register 310 in other manners.

Each of the 120-bit registers 311-315 is coupled to a corresponding one of DES blocks 301-305. Each of DES blocks 301-305 operates in accordance with the conventional Data Encryption Standard (DES). DES is a widely used method of data encryption, which applies a 56-bit key to a 64-bit block of data, in order to obtain a 64-bit block of encrypted data. DES is specified in the American National Standards Institute (ANSI) X3.93 and X3.106 standards, and in the Federal Information Processing Standards (FIPS) 46 and 81.

In the described embodiment, the 64-bits at bit locations [119:56] of each 120-bit register are applied to a data input bus of a corresponding DES block, and the 56-bits at bit locations [55:0] of each 120-bit register are applied to a key input bus of a corresponding DES block. For example, the 64-bits at bit locations [119:56] of 120-bit register 311 are applied to the input data bus of DES block 301, and the 56-bits at bit locations [55:0] of 120-bit register 311 are applied to the key input bus of DES block 301. In other embodiments, bits from registers 311-315 can be applied to DES blocks 301-305 in other manners.

In response to the data bits received from registers 311-315, DES blocks 301-305 provide 64-bit hashed output values H1-H5, respectively. The hashed output values H1 and H2 provided by DES blocks 301 and 302 are applied to exclusive OR block 321. Each of exclusive OR blocks 321-324 provides a logical exclusive OR function of the input values. Thus, exclusive OR block 321 provides a hashed output value H6, which is the logical exclusive OR of hashed output values H1 and H2. The hashed output values H4 and H5 provided by DES blocks 304 and 305 are applied to exclusive OR block 324, thereby creating hashed output value H7, which is the logical exclusive OR of hashed output values H4 and H5. The hashed output values H3 and H6 are applied to exclusive OR block 322. In response, exclusive OR block 322 provides a hashed output value H8, which is the logical exclusive OR of hashed output values H3 and H6. Finally, the hashed output values H7 and H8 are applied to exclusive OR block 324. In response, exclusive OR block 324 provides a hashed output value H9, which is the logical exclusive OR of hashed output values H7 and H8.

In the described embodiment, the first 8-bits of hashed output value H1 are concatenated with the 64-bits of hashed output value H9, thereby creating 72-bit hashed output value, H_VALUE. In other embodiments, the 72-bit hashed output value H_VALUE can be created in other manners from the hashed data values H1-H5.

FIG. 3 also illustrates 8-bits of the hashed output value H7 being brought out as a collision resolution value (CR_VALUE). The 8-bit collision resolution value (CR_VALUE) is therefore largely independent of the 72-bit hashed output value. It is desirable for the collision resolution value CR_VALUE to be independent of the hashed output value H_VALUE, so that if two different input data values hash to the same hashed output value H_VALUE, it is unlikely that these two input data values will also hash to the same collision resolution value CR_VALUE. The probability of two different input values hashing to the same hashed output value H_VALUE and the same collision resolution value CR_VALUE is $1:2^{80}$. This probability does not increase as CAM array 201 and RAM 210 are filled with values.

Figure 4:
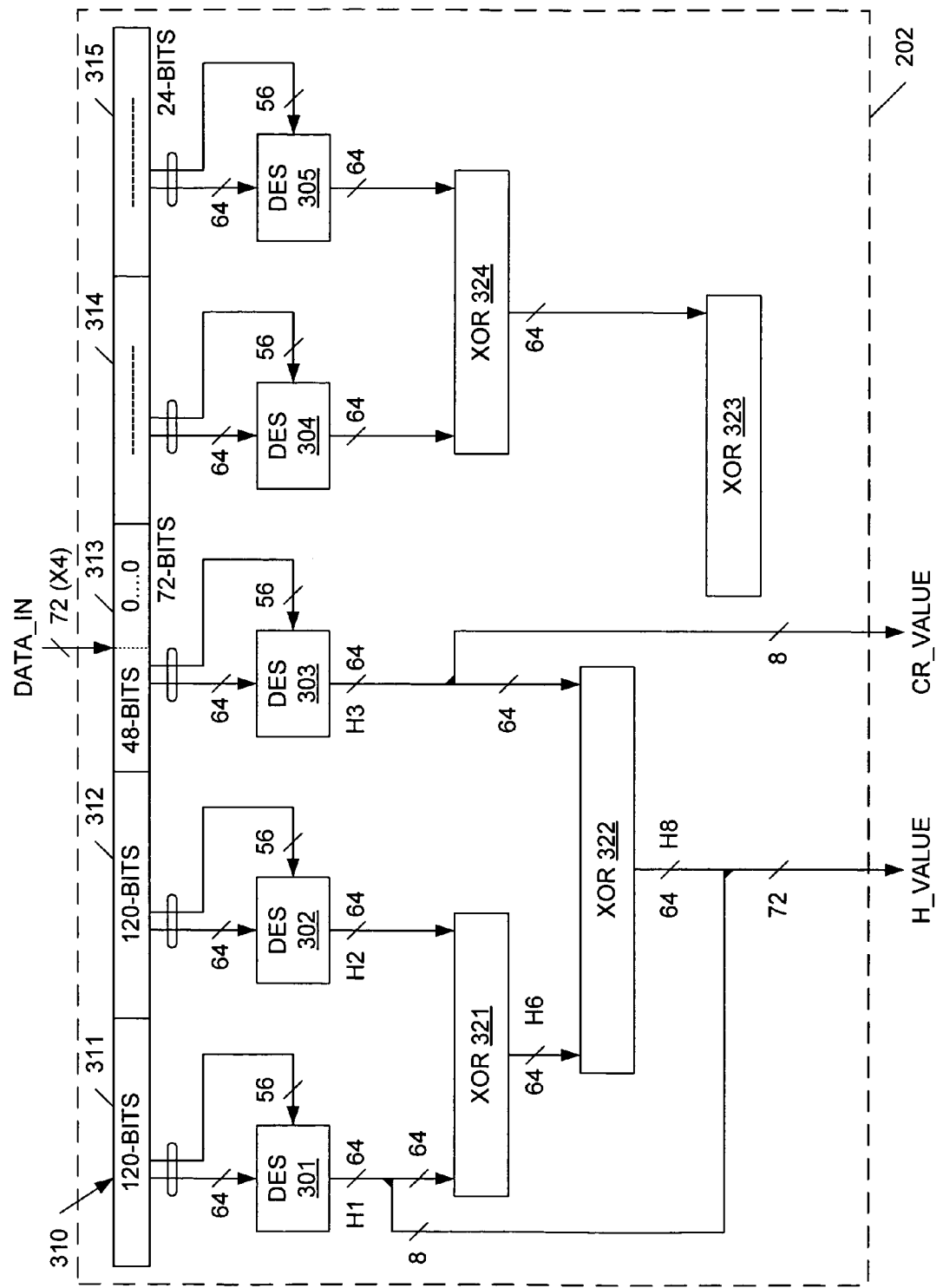
FIG. 4 is a block diagram of the hardware hashing circuit of FIG. 2, configured to receive a 288-bit input data value, in accordance with one embodiment of the present invention.

FIG. 4 is a block diagram of hardware hashing circuit 202, configured to receive a 288-bit input data value, in accordance with one embodiment of the present invention (i.e., configuration bits have a value of "10"). Hardware hashing circuit 202 includes the same elements described above in connection with FIG. 3. However, these elements are configured in a different manner in FIG. 4, in response to the configuration bits stored in register 203 (or provided externally). More specifically, four consecutive 72-bit DATA_IN values are loaded into input register 310 in the 288-bit configuration of FIG. 4. In the described embodiment, the first 72-bit DATA_IN value is loaded into bit locations [119:48] of register 311; the second 72-bit DATA_IN value is loaded into bit locations [47:0] of register 311 and bit locations [119:96] of register 312; the third 72-bit DATA_IN value is loaded into bit locations [95:24] of register 312; and the fourth 72-bit DATA_IN value is loaded into bit locations [23:0] of register 312 and bit locations [119:72] of register 313. Bit locations [71:0] of register 313 are loaded with logic "0" values. In other embodiments, the four 72-bit DATA_IN values and 72 logic "0" values can be loaded into register 310 in other manners.

Each of DES blocks 301-303 operates in accordance with the conventional Data Encryption Standard (DES) in the manner described above, thereby creating 64-bit hashed output values H1, H2 and H3, respectively. The hashed output values H1 and H2 are applied to exclusive OR block 321, thereby creating 64-bit hashed output value H6. The hashed output values H3 and H6 are applied to exclusive OR block 322, thereby creating hashed output value H8.

In the described embodiment, the first 8-bits of hashed output value H1 are concatenated with the 64-bits of hashed output value H8, thereby creating 72-bit hashed output value, H_VALUE. In other embodiments, the 72-bit hashed output value H_VALUE can be created in other manners from the hashed data values H1-H3. Note that registers 314 and 315 do not store any relevant data, and that exclusive OR blocks 323 and 324 are not used (i.e., are disconnected in response to the configuration bits) in this embodiment.

FIG. 4 also illustrates 8-bits of the hashed output value H3 being brought out as a collision resolution value (CR_VALUE). Again, the 8-bit collision resolution value (CR_VALUE) is largely independent of the hashed output value H_VALUE. Although FIGS. 3 and 4 illustrate input values having widths of 576-bits and 288-bits, it is understood that many other widths can be implemented in other embodiments.

In the above-described manner, hardware hashing circuit 202 provides a 72-bit hashed output value H_VALUE to CAM array 201 as a comparison value. Hardware hashing circuit 202 also provides an 8-bit collision resolution value CR_VALUE to RAM 210 and comparator 208. As described in more detail below, CAM array 201 is programmed to store a plurality of hashed values. In the described embodiment, CAM array 201 has a width of 72-bits and a depth of 128K (131,072) entries, such that CAM array 201 is capable of storing 128K 72-bit hashed values. CAM array 201 can have other depths and widths in other embodiments.

If the hashed output value H_VALUE matches an entry of CAM array 201, then CAM array 201 will activate a HIT control signal, which is provided to AND gate 209. In addition, CAM array 201 will provide an index value (INDEX), which points to an entry of RAM 210.

In the described embodiment, RAM 210 has a width of 32-bits, including a RAM section 210A having a width of 8-bits, and a RAM section 210B having a width of 24-bits. RAM section 210A is dedicated to storing 8-bit collision resolution values (CR_VALUE) provided by hardware hashing circuit 202. RAM section 210B is dedicated to storing 24-bit data values used to control the processing (e.g., routing) of the original input data value (DATA_IN). When accessed, these 24-bit data values can be used to address locations inside a 16 million word space in a system memory in NPU 220. In this case, RAM 210 is referred to as an "indirection" RAM. There is minimal additional hardware cost associated with storing the 8-bit collision resolution values in RAM 210. In systems where 32-bit wide RAMs are being used to store 24-bit data values, the 8-bit RAM section 210A is "free".

The entry in RAM 210 identified by the INDEX value therefore contains an 8-bit collision resolution value and a 24-bit data value that is associated with the original input data value, DATA_IN. Upon receiving the INDEX value, RAM 210 provides the associated collision resolution value as a retrieved collision resolution value RCR_VALUE, and provides the associated data value as the output data value, DATA_OUT. In the embodiment illustrated in FIG. 2, the DATA_OUT value is provided directly to NPU 220. NPU 220 uses the DATA_OUT value in a manner known to those of ordinary skill in the art (i.e., to control the routing of an associated packet). However, other system configurations can be implemented in accordance with other embodiments of the present invention. In the described embodiment, RAM 210 provides the retrieved collision resolution value RCR_VALUE to comparator 208. Thus, comparator 208 receives both the retrieved collision resolution value RCR_VALUE and the collision resolution value CR_VALUE provided by hardware hashing circuit 202.

If comparator 208 determines that the collision resolution value received from hardware hashing circuit 202 does not match the retrieved collision resolution value received from RAM section 210A, then comparator 208 activates a NOT_EQUAL control signal. If comparator 208 determines that the collision resolution value received from hardware hashing circuit 202 matches the retrieved collision resolution value received from RAM section 210A, then comparator 208 does not activate the NOT_EQUAL control signal.

Figure 1:
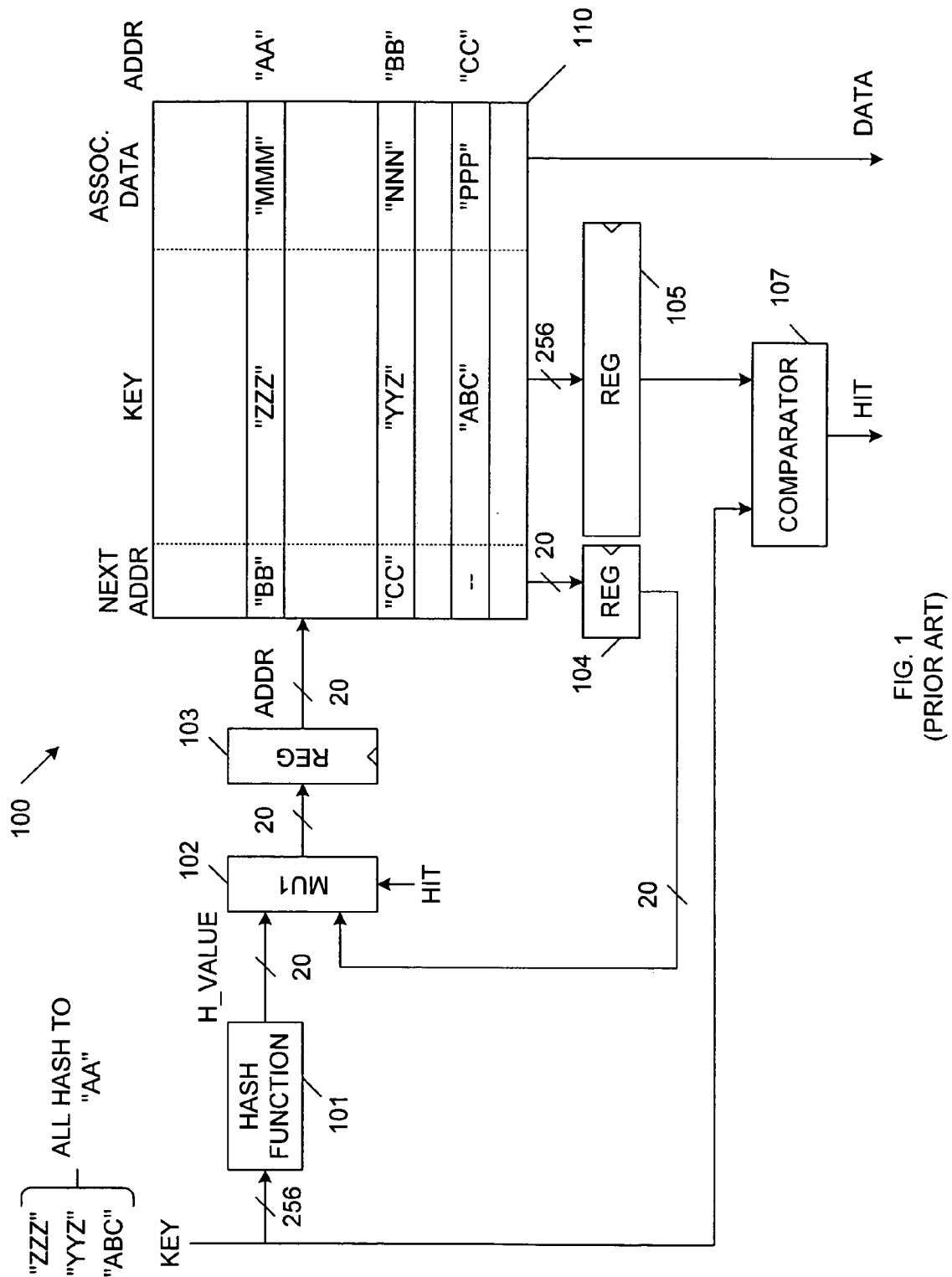
FIG. 1 is a block diagram of a conventional system used to process wide data values

As described above, CAM array 201 activates a HIT control signal if the hashed output value H_VALUE matches an entry of CAM array 201. The HIT control signal is applied to one input terminal of AND gate 209, and the NOT_EQUAL signal is applied to the other input terminal of AND gate 209. If the HIT and NOT_EQUAL control signals are both activated, AND gate 209 activates a COLLISION control signal, thereby indicating that a collision has occurred. The COLLISION control signal is provided to NPU 220. Upon receiving an activated COLLISION control signal, NPU 220 processes the input data value in a conventional manner. For example, NPU 220 can include conventional system 100, which is described in more detail above in connection with FIG. 1. Advantageously, the present invention reduces the frequency with which this conventional system 100 must be used to resolve collisions.

The operation of system 200 will now be described in more detail.

Figure 5A:
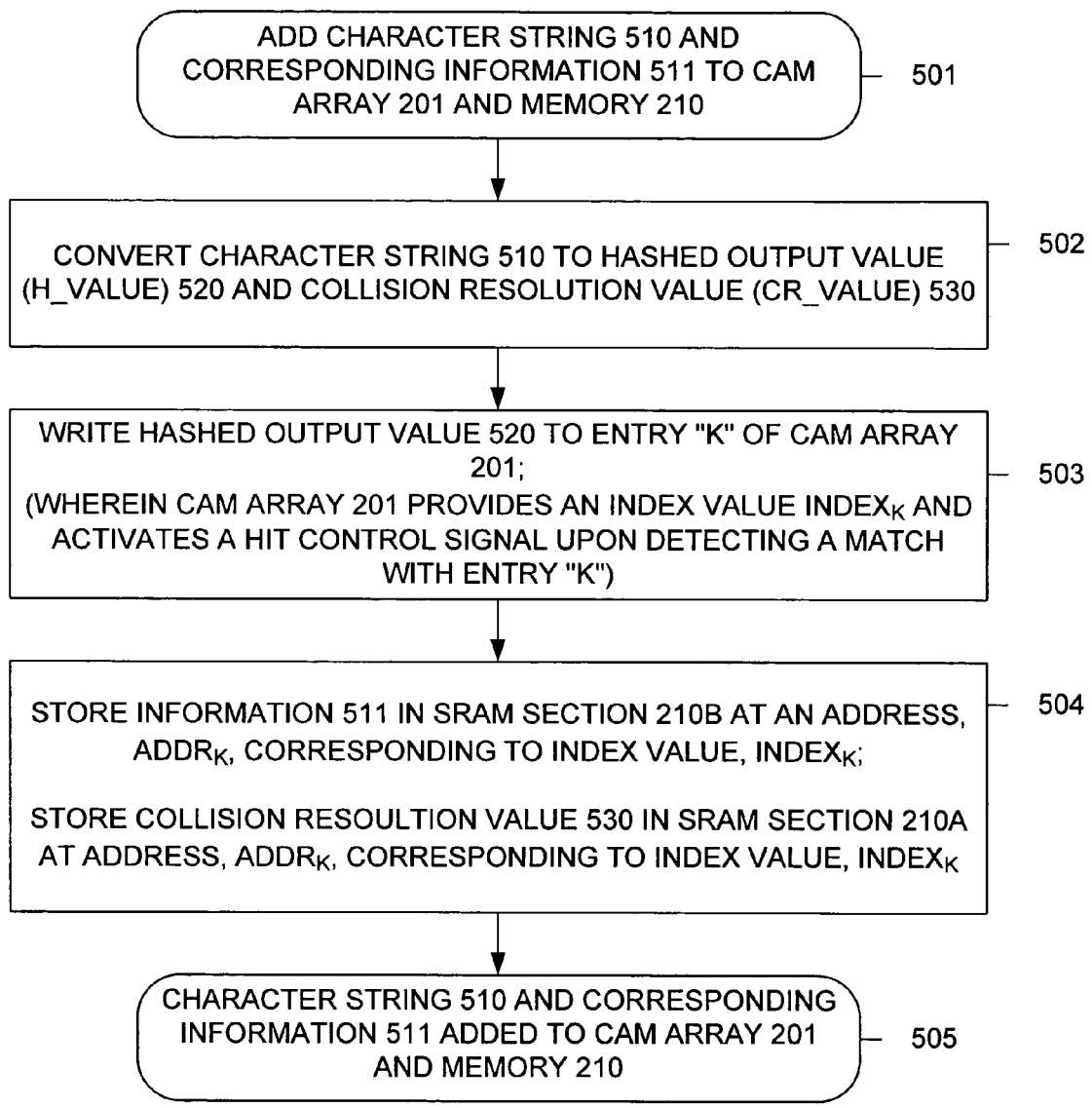
FIG. 5A is a flow diagram illustrating the addition of an input data value and corresponding information to a CAM array and corresponding memory in accordance with one embodiment of the present invention.

FIG. 5A is a flow diagram illustrating the addition of a wide input data value 510 and the corresponding information 411 to CAM array 201 and RAM 210 of system 200 in accordance with one embodiment of the present invention. The addition of wide input data value 510 and the corresponding information 511 is initiated in Step 501. The wide input data value 510 is converted to a 72-bit hashed output value 520 and an 8-bit collision resolution value 530 by hardware hashing circuit 202 in the manner described above (Step 502). The hashed output value 520 is then written to an entry (i.e., entry "K", where K is a whole number from 0 to 131,071, inclusive) of CAM array 201 (Step 503). Note that if a hashed output value subsequently applied to CAM array 201 during a compare operation matches the hashed output value 520 stored in entry "K", then CAM array 201 will provide a corresponding output index value, $INDEX_K$, and activate the HIT control signal (Step 503). The information 511 corresponding to wide input data value 510 is written to RAM section 210B at an address $ADDR_K$ corresponding with index value, $INDEX_K$ (Step 504). At the same time, the associated collision resolution value 530 is written to RAM section 210A at the address $ADDR_K$ corresponding with index value, $INDEX_K$ (Step 504). Thus, the index value $INDEX_K$ can be used to access the information 511 and associated collision resolution value 530 stored at address $ADDR_K$ of RAM 210 during a subsequent compare operation. At this time, the wide input data value 510 and the corresponding information 511 have been added to CAM array 201 and RAM 210 (Step 505).

Figure 5B:
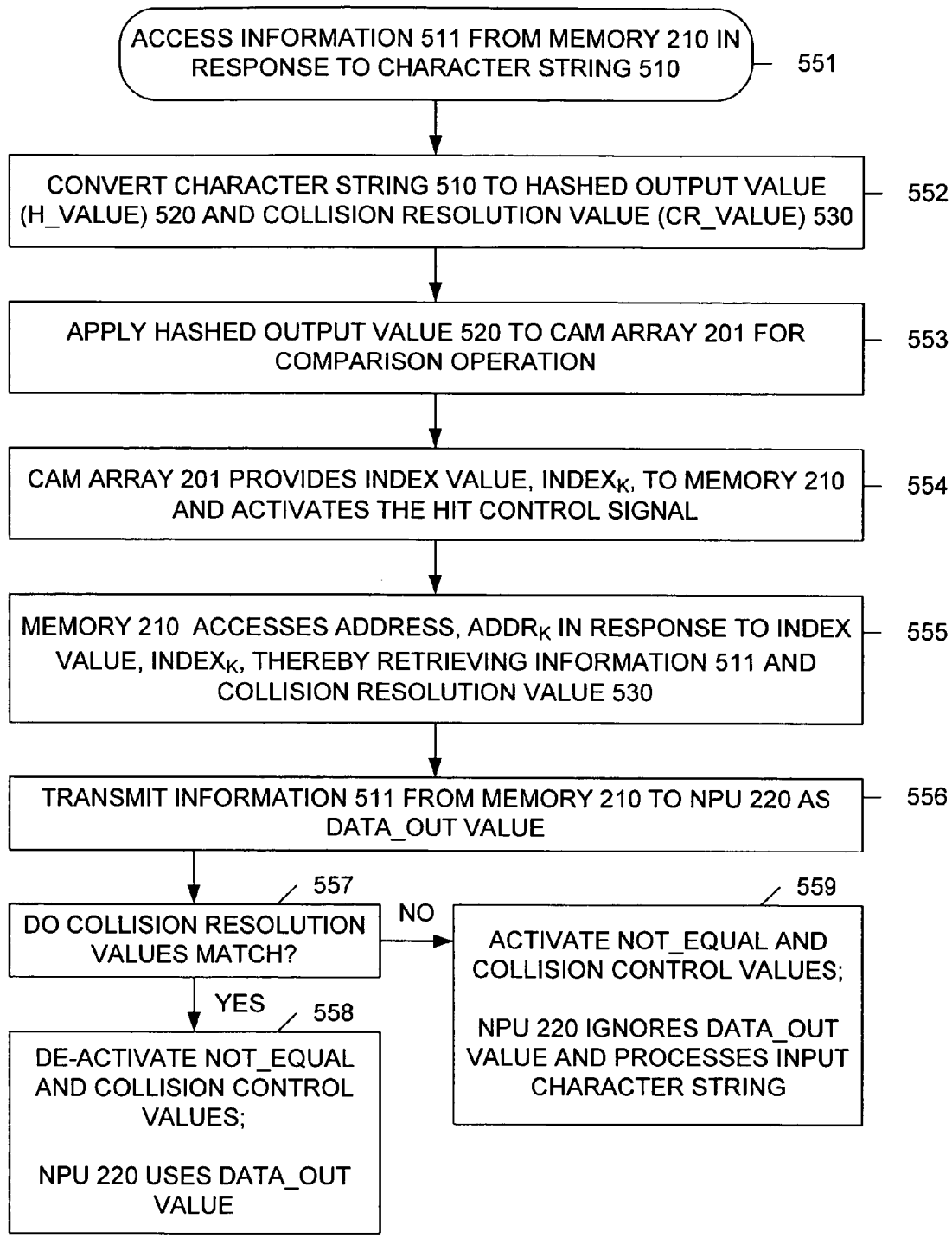
FIG. 5B is a flow diagram illustrating the accessing of information from a memory in response to an input data value in accordance with one embodiment of the present invention.

FIG. 5B is a flow diagram illustrating the accessing of information 511 from RAM 210 in response to wide input data value 510 in accordance with one embodiment of the present invention. The access of information 511 is initiated in Step 551. Wide input data value 510 is applied to hardware hashing circuit 202, which converts this input data value 510 to hashed output value 520 and collision resolution value 530 in the manner described above (Step 552). The associated hashed output value 520 is applied to CAM array 201, thereby comparing the hashed output value 520 with the hashed values previously stored in CAM array 201 (Step 553). Because the hashed output value 520 was previously written to CAM array 201, a match exists in the present example. As a result, CAM array 201 activates the HIT control signal, and provides the associated index value, $INDEX_K$, to RAM 210 (Step 554).

CAM array 201 uses the $INDEX_K$ value to access the information 511 and the collision resolution value 530 stored at address $ADDR_K$ of RAM 210 (Step 555). In one embodiment, the $INDEX_K$ value is equal to the address value $ADDR_K$. In another embodiment, the $INDEX_K$ value is mapped to the address value $ADDR_K$. The information 411 retrieved from RAM 210 is then provided to NPU 220 as the DATA_OUT value (Step 556). The associated collision resolution value 530 retrieved from RAM 210 is provided to comparator 208 (Step 556).

Comparator 208 determines whether the collision resolution value 530 retrieved from RAM 210 matches the collision resolution value 530 provided by hardware hashing circuit 202 (Step 557). In the present example, comparator 208 detects a match (Step 557, yes branch). In response, comparator 208 de-activates the NOT_EQUAL control signal, thereby causing AND gate 209 to provide a de-activated COLLISION control signal. This de-activated COLLISION control signal causes NPU 220 to use the information 511 received from RAM 210 (Step 558).

Note that the nature of the hashing function, wherein a longer data value is reduced to a shorter data value, makes it possible for a different wide input data value 580 to produce the same hashed output value 520 as wide input data value 510. However, in this case, it is unlikely that the collision resolution value 530 associated with input data value 510 will also be the same as the collision resolution value 590 associated with this different input data value 580. In the described embodiment, the odds of the 8-bit collision resolution values 530 and 590 also matching are about 1 in 256.

If the collision resolution value 530 does not match the collision resolution value 590 (Step 557, no branch), then comparator 208 activates the NOT_EQUAL control signal, and logical AND gate 209 activates the COLLISION control signal. Upon receiving the activated COLLISION control signal, NPU 220 ignores the DATA_OUT value received from RAM 210, and instead processes the wide input data value 510 in a conventional manner (Step 559). In the foregoing manner, the use of collision resolution values reduces the frequency with which the COLLISION control signal is activated. Thus, the lengthy processing of the wide input data values will be required infrequently.

The use of RAM 210 results in relatively fast collision detection (compared with software-based collision detection). In other embodiments, the collision resolution value can have other widths. For example, the collision resolution value can be made wider, thereby enabling more collisions to be resolved. In yet another embodiment, a completely independent hashing function can be used to generate the collision resolution value (CR_VALUE).

If collisions still occur with an unacceptable frequency, hardware hashing circuit 202 may be modified to provide longer a longer hashed output value, thereby reducing the possibility of a collision. For example, rather than creating a 72-bit hashed output value, hardware hashing circuit 202 may be modified to provide a 144-bit hashed output value. Such a configuration would be supported by configuration register 203. In this case, the 144-bit hashed output value (H_VALUE) would be stored in two entries of CAM array 201. As a result, the effective depth of CAM array 201 would be reduced from 128K entries to 64K entries. Moreover, each comparison would require two compare operations, one for each of the two entries in CAM array 201. This method can further be extended to longer hashed output values, as necessary.

In accordance with various embodiments, the different elements of system 200 can be located on various integrated circuit chips. For example, in one embodiment, NPU 220 can be located on one IC chip, CAM array 201 and hardware hashing circuit 202 can be located on another IC chip, and RAM 210 can be located on yet another IC chip. Comparator 208 and logical AND gate 209 can be located on the same chip as either CAM array 201 or RAM 210.

In one variation, RAM 210 can provide the COLLISION control signal and the DATA_OUT value to the IC chip that includes CAM array 201. In this variation, the IC chip that includes CAM array 201 provides the COLLISION control signal and the DATA_OUT value to NPU 220, thereby eliminating the need for a direct interface between RAM 210 and NPU 220.

In another variation, NPU 220 and RAM 210 can be located on the same IC chip, and CAM array 201 and hardware hashing circuit 202 can be located on another IC chip.

Figure 6A:
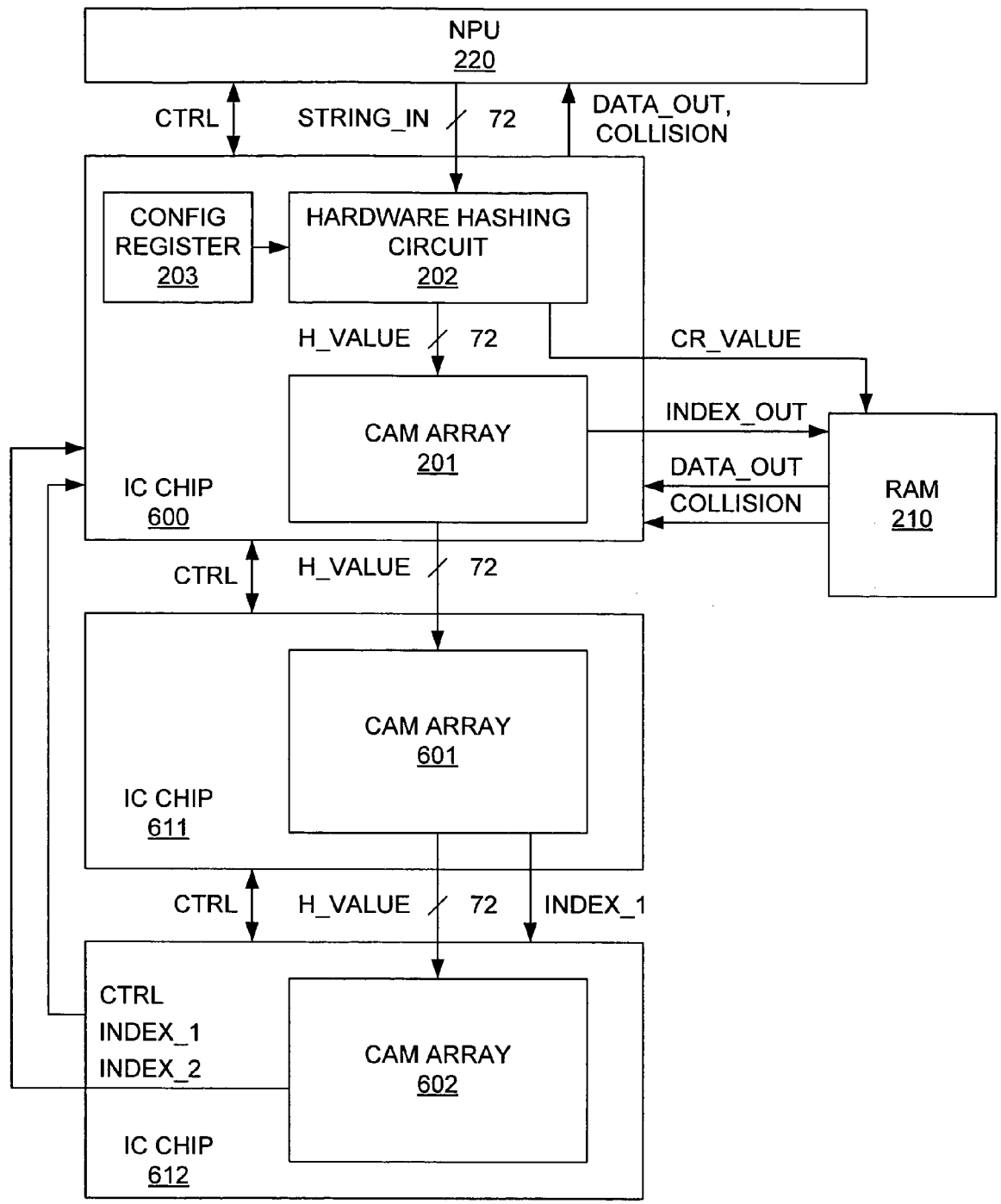
FIGS. 6A and 6B are block diagrams that illustrate variations of the system of FIG. 2, in accordance with alternate embodiments of the present invention.

FIG. 6A is a block diagram illustrating one variation of the present invention, wherein an IC chip 600, which includes CAM array 201, hardware hashing circuit 202, and configuration register 203, provides the hashed output value (H_VALUE) for use with a plurality of CAM arrays 601-602, in addition to CAM array 201. CAM arrays 601 and 602 are located on separate IC chips 611 and 612, respectively. The hashed output value H_VALUE provided by hardware hashing circuit 202 is routed to CAM arrays 201, 601 and 602 in a daisy-chained manner. Control values CTRL are also routed to IC chips 600, 611 and 612 in a daisy-chained manner. In response, CAM arrays 601 and 602 provide index values INDEX_1 and INDEX_2, respectively. IC chip 611 provides the INDEX_1 value and associated control values, CTRL, to IC chip 612. IC chip 612 provides the INDEX_1 value, the INDEX_2 value, and associated control values, CTRL, to IC chip 600. In response, CAM array 201 provides an output index value INDEX_OUT, which takes into account the results from CAM arrays 201, 601 and 602.

Hardware hashing circuit 202 provides the collision resolution value CR_VALUE to RAM 210. In the manner described above, RAM 210 returns the COLLISION control value and the DATA_OUT value to IC chip 600. IC chip 600 returns the COLLISION control value and the DATA_OUT value to NPU 220. NPU 220 processes the DATA_OUT and COLLISION control values in the manner described above. The INDEX_OUT value can also be routed to NPU 220, along with the COLLISION control value and the DATA_OUT value. Although three CAM arrays are connected in FIG. 6A, it is understood that other numbers of CAM arrays can be connected in other embodiments.

Figure 6B:
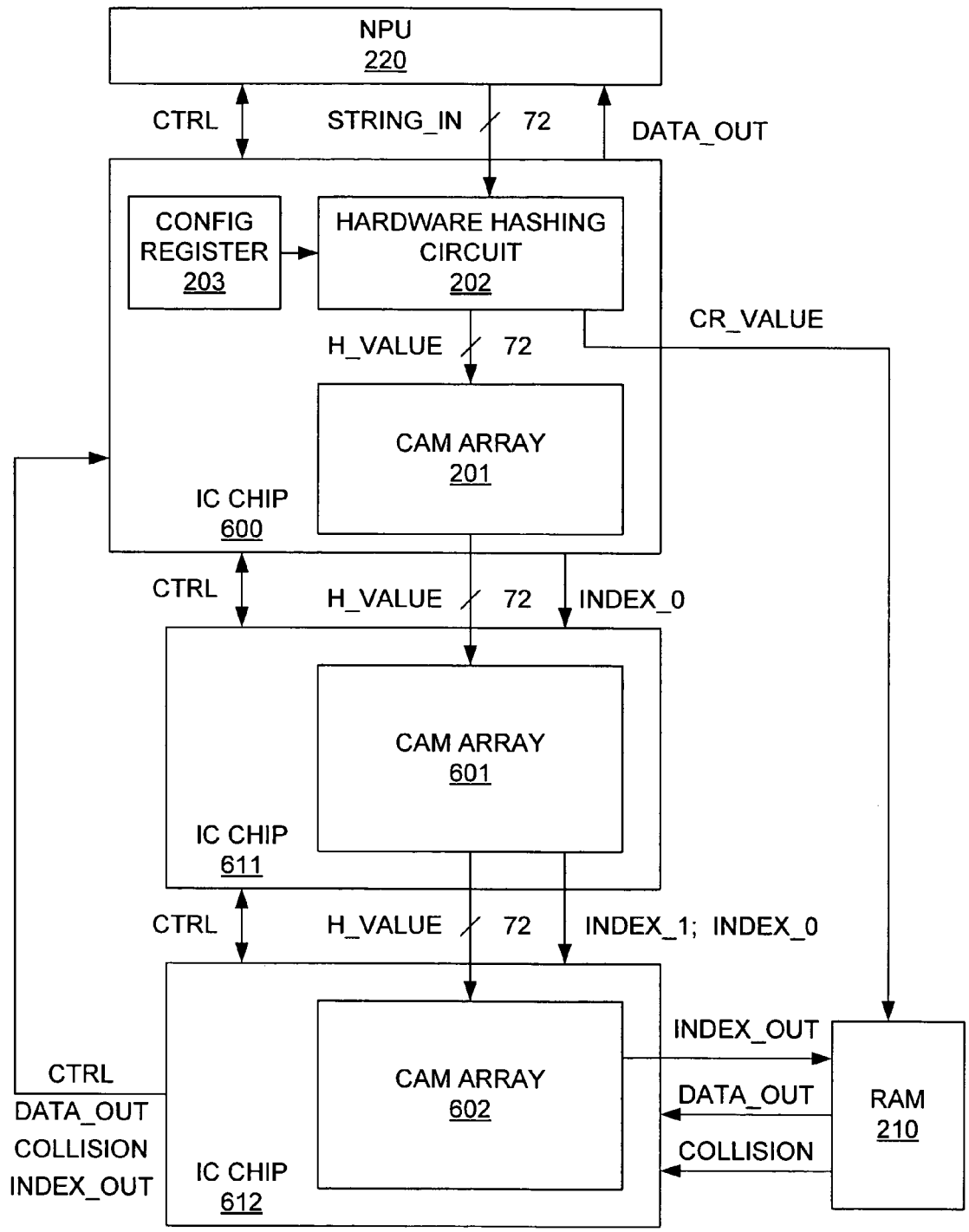

FIG. 6B is a block diagram illustrating a variation of the system of FIG. 6A. Similar elements in FIGS. 6A and 6B are labeled with similar reference numbers. Thus, hardware hashing circuit 202 provides the hashed output value (H_VALUE) to CAM arrays 201, 601 and 602 in a daisy-chained manner. CAM arrays 201 and 601 provide index values INDEX_0 and INDEX_1, respectively, in response to the hashed output value, H_VALUE. IC chip 200 provides index value INDEX_0 and associated control values CTRL to IC chip 611. IC chip 611 provides the INDEX_0 value, the INDEX_1 value and associated control values CTRL to IC chip 612. In response, CAM array 602 provides an output index value INDEX_OUT, which takes into account the results from CAM arrays 201, 601 and 602.

Hardware hashing circuit 202 provides the collision resolution value CR_VALUE to RAM 210. In the manner described above, RAM 210 returns the COLLISION control value and the DATA_OUT value to IC chip 612. IC chip 612 returns the COLLISION control value and the DATA_OUT value and associated control values, CTRL, to IC chip 200, which in turn, provides the DATA_OUT and COLLISION control values to NPU 220. NPU 220 processes the DATA_OUT and COLLISION control values in the manner described above. The INDEX_OUT value can also be routed to NPU 220, along with the DATA_OUT and COLLISION control values. Although three CAM arrays are connected in FIG. 6B, it is understood that other numbers of CAM arrays can be connected in other embodiments.

In another variation of the present invention, IC chip 600 can be separated into two separate IC chips, wherein hardware hashing circuit 202 and configuration register 203 are located on one IC chip, and CAM array 201 is located on another IC chip.

Figure 7:
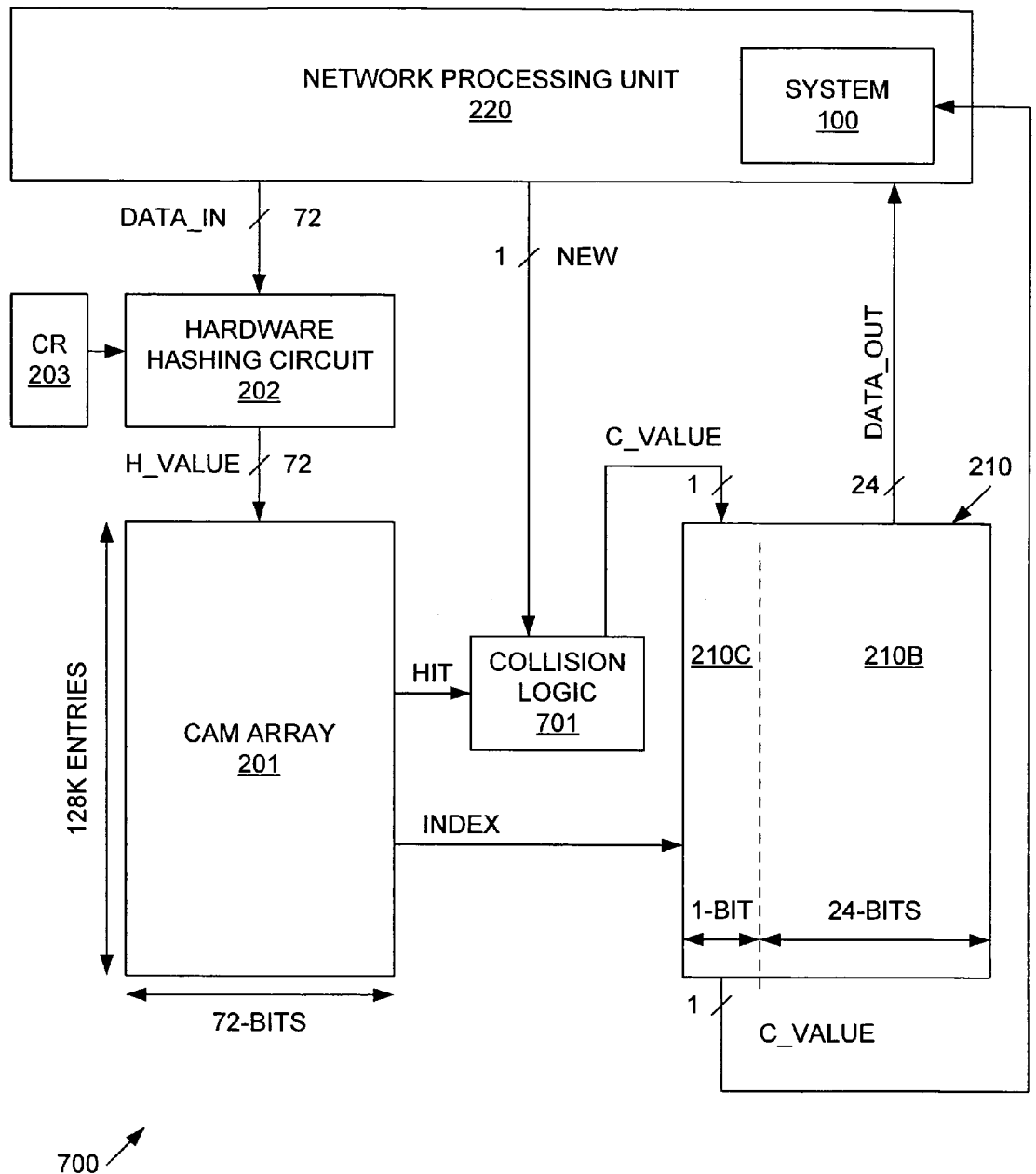
FIG. 7 is a block diagram of a collision resolution system in accordance with another embodiment of the present invention.

FIG. 7 is a block diagram of a collision resolution system 700 in accordance with another embodiment of the present invention. Because collision resolution system 700 includes many of the same elements as system 200 (FIG. 2), similar elements in FIGS. 2 and 7 are labeled with similar reference numbers. Thus, collision resolution system 700 includes CAM array 201, hardware hashing circuit 202, configuration register 203, RAM 210 and network processing unit 220. In addition, system 700 includes collision logic block 701, which is coupled to receive the HIT signal from CAM array 201, as well as a NEW control signal, which indicates when NPU 220 is adding a new value to CAM array 201 and RAM 210. In system 700, RAM 210 includes a 1-bit section 210C, which replaces 8-bit section 210A of system 200.

The addition of wide input data values and the corresponding information to CAM array 201 and RAM 210 of system 700 in accordance with one embodiment of the present invention will now be described. A first wide input data value $DATA\_IN_1$ and corresponding information $INFO_1$ are initially added to system 700. NPU 220 maintains a list of each wide input data value stored in system 700. When NPU 220 determines that a new wide input data value is to be added to system 700, NPU 220 activates a 1-bit NEW control signal, which is provided to collision logic 701. The first wide input data value $DATA\_IN_1$ is stored in NPU 220, and is converted to a 72-bit hashed output value $H\_VALUE_1$ by hardware hashing circuit 202 in the manner described above.

The hashed output value $H\_VALUE_1$ is initially compared with the contents of CAM array 201. In the described example, this hashed output value H_VALUE$_1$ does not match any of the previously stored entries of CAM array 201. As a result, the HIT signal is de-activated low. This low HIT signal is provided to collision logic 701. In response, collision logic 701 provides the low HIT signal as the collision value C_VALUE.

The hashed output value H_VALUE$_1$ is then written to an entry (i.e., entry "K") of CAM array 201. Note that if a hashed output value subsequently applied to CAM array 201 during a compare operation matches the hashed output value H_VALUE$_1$ stored in entry "K", then CAM array 201 will provide a corresponding output index value, INDEX$_K$, and activate the HIT control signal. The information INFO$_1$ corresponding to wide input data value DATA_IN$_1$ is written to RAM section 210B at an address ADDR$_K$ corresponding with index value, INDEX$_K$. At the same time, collision logic 701 writes a low collision resolution value C_VALUE to RAM section 210C at the address ADDR$_K$. As described above, this low collision resolution value C_VALUE is written in response to the low HIT signal provided during the compare operation.

Thus, the index value INDEX$_K$ can be used to access the information INFO$_1$ and associated low collision resolution value stored at address ADDR$_K$ of RAM 210 during a subsequent compare operation. This low collision resolution value indicates that the retrieved information INFO$_1$ is valid.

Additional wide input data values can be added to system 700 in a similar manner, as long as the hashed output value provided in response to the new wide input data value does not match a hashed output value previously stored in CAM array 201 (i.e., no collision exists). If a new wide input data value provides a hashed output value that matches a hashed output value previously stored in CAM array 201, then processing is modified in the manner described below.

A second wide input data value DATA_IN$_2$, which hashes to the hashed output value H_VALUE$_1$, and the corresponding information INFO$_2$ are added to system 700 in the following manner. NPU 220 activates the 1-bit NEW control signal, which is provided to collision logic 701. The second wide input data value DATA_IN$_2$ is stored in NPU 220, and is converted to the 72-bit hashed output value H_VALUE$_1$ by hardware hashing circuit 202 in the manner described above.

The hashed output value H_VALUE$_1$ is initially compared with the contents of CAM array 201. In the described example, this hashed output value H_VALUE$_1$ matches the hashed output value H_VALUE$_1$ previously stored in address ADDR$_K$ of CAM array 201. As a result, the HIT signal is activated high, thereby indicating that a collision exists. This high HIT signal is provided to collision logic 701. In response, collision logic 701 activates the collision resolution value C_VALUE to a logic high state.

Collision logic 701 writes this high collision resolution value C_VALUE to RAM section 210C at the address ADDR$_K$. This high collision resolution value C_VALUE indicates that the associated information stored at address ADDR$_K$ of RAM section 210B is invalid. Thus, during subsequent comparison operations, wherein the hashed output value H_VALUE has a value of H_VALUE$_1$, the collision resolution value C_VALUE retrieved from RAM section 210C will have a high value. This high value is provided to NPU 220, which in response, processes the associated wide input data value (e.g., DATA_IN$_1$ or DATA_IN$_2$) in a conventional manner. For example, NPU 220 can use system 100 when the collision resolution value retrieved from RAM 210 has a logic high value.

Although hardware hashing circuit 202 has been described using DES encryption, it is understood that other hardware hashing circuitry can be used to create the hashed output value H_VALUE. For example, hardware hashing circuit 202 can implement one or more conventional hashing methods, including, but not limited to: a division-remainder method, a folding method, a radix transformation, or digit rearrangement.

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:

1. A system comprising:
a port for receiving an input data value;
a hardware hashing circuit configured to perform a hashing function on the input data value, wherein the hashing function creates a hashed output value and a collision resolution value in response to the input data value;
a content addressable memory (CAM) array coupled to receive the hashed output value, the CAM array configured to provide an index value in response to the hashed output value and activate a hit control signal if the hashed output value matches an entry of the CAM array; and
a random access memory coupled to receive the index value from the CAM array, wherein the random access memory stores a collision resolution value and information associated with the input data value in a first entry, wherein the first entry has an address associated with the index value.

2. The system of claim 1, wherein the random access memory is configured to provide the information and the collision resolution value from the first entry in response to the index value.

3. system of claim 2, further comprising a comparator configured to receive the collision resolution value provided by the hardware hashing circuit and the collision resolution value provided by the random access memory.

4. The system of claim 3, further comprising a logic circuit coupled to the comparator and the CAM array.

5. The system of claim 4, wherein the logic circuit is configured to activate a collision control signal if the hit control signal is activated and the collision resolution value provided by the hardware hashing circuit does not match the collision resolution value provided by the random access memory.

6. The system of claim 5, further comprising a network processing unit configured to provide the input data value to the first port, receive the information from the random access memory, and receive the collision control signal from the logic circuit.

7. The system of claim 4, wherein the logic circuit is a logical AND gate.

8. The system of claim 1, wherein the collision resolution value has a width of 8-bits.

9. The system of claim 1, wherein the hardware hashing circuit is coupled to the random access memory, thereby providing the collision resolution value to the random access memory.

10. The system of claim 1, further comprising a configuration bus for providing one or more configuration bits to the hardware hashing circuit, wherein the hardware hashing circuit is configured to process input data values having different lengths in response to the one or more configuration bits.

11. The system of claim 1, wherein the CAM array is a binary CAM array.

12. The system of claim 1, wherein the hardware hashing circuit comprises a plurality of Data Encryption Standard (DES) circuits.

13. The system of claim 1, wherein the CAM array is located on a plurality of integrated circuit chips that are cascaded in a daisy-chained configuration.

14. The system of claim 1, wherein the CAM array and the hardware hashing circuit are located on the same integrated circuit chip.

15. The system of claim 1, wherein the CAM array and the hardware hashing circuit are located on separate integrated circuit chips.

16. A method of implementing a content addressable memory (CAM) system comprising:
receiving an input data value having a first length;
hashing the input data value in a hardware hashing circuit, thereby creating a hashed output value having a second length, shorter than the first length, and a collision resolution value having a third length, shorter than the first length;
comparing the hashed output value with hashed values stored in a content addressable memory (CAM) array;
providing an index value and activating a hit control signal with the CAM array in response to the hashed output value if the hashed output value matches one of the hashed values stored in the CAM array; and
retrieving a collision resolution value and information associated with the input data value from a random access memory in response to the index value.

17. The method of claim 16, further comprising comparing the collision resolution value provided by the hardware hashing circuit and the collision resolution value retrieved from the random access memory.

18. The method of claim 17, further comprising activating a collision control signal if the hit control signal is activated and the collision resolution value provided by the hardware hashing circuit does not match the collision resolution value provided by the random access memory.

19. The method of claim 18, further comprising receiving the information from the random access memory and the collision control signal with a network processing unit.

20. The method of claim 16, further comprising providing the collision resolution value from the hardware hashing circuit to the random access memory.

21. The method of claim 16, further comprising:
providing one or more configuration bits representative of the first length to the hardware hashing circuit; and
configuring the hardware hashing circuit in response to the one or more configuration bits.

22. The method of claim 16, further comprising hashing the input data value in accordance with the Data Encryption Standard (DES)

23. A system comprising:
a port for receiving an input data value;
a hardware hashing circuit configured to perform a hashing function on the input data value, wherein the hashing function creates a hashed output value in response to the input data value;
a content addressable memory (CAM) array coupled to receive the hashed output value, the CAM array configured to provide an index value in response to the hashed output value and activate a hit control signal if the hashed output value matches an entry of the CAM array;
a collison logic circuit coupled to receive the hit control signal, wherein the collision logic is configured to activate a collision resolution value if the hit control signal is activated when a new input data value is being added to the system; and
a random access memory coupled to receive the index value from the CAM array, wherein the random access memory stores the collision resolution value from the collision logic circuit and information associated with the input data value in a first entry, wherein the first entry has an address associated with the index value.

24. The system of claim 23, wherein the random access memory is configured to provide the information and the collision resolution value from the first entry in response to the index value.

25. The system of claim 24, further comprising a network processing unit configured to provide the input data value to the first port, and receive the information and the collision control value from the random access memory.

26. The system of claim 25, wherein the network processing unit is configured to process the input data value if the collusion resolution value has an activated state.

27. The system of claim 23, wherein the collision resolution value has a width of 1-bit.

28. The system of claim 23, further comprising a configuration bus for providing one or more configuration bits to the hardware hashing circuit, wherein the hardware hashing circuit is configured to process input data values having different lengths in response to the one or more configuration bits.

29. The system of claim 23, wherein the CAM array is a binary CAM array.

30. The system of claim 23, wherein the hardware hashing circuit comprises a plurality of Data Encryption Standard (DES) circuits.

31. The system of claim 23, wherein the CAM array is located on a plurality of integrated circuit chips that are cascaded in a daisy-chained configuration.

32. The system of claim 23, wherein the CAM array and the hardware hashing circuit are located on the same integrated circuit chip.

33. The system of claim 23, wherein the CAM array and the hardware hashing circuit are located on separate integrated circuit chips.

34. method of adding a new input data value to a content addressable memory (CAM) system comprising:
receiving the new input data value, which has a first length;
hashing the new input data value in a hardware hashing circuit, thereby creating a hashed output value having a second length, shorter than the first length;
comparing the hashed output value with hashed values stored in a content addressable memory (CAM) array;
providing an index value and activating a hit control signal with the CAM array in response to the hashed output value if the hashed output value matches one of the hashed values stored in the CAM array; and
storing a collision resolution value having an activated state in a random access memory at an address associated with the index value if the hit control signal is activated.

35. The method of claim 34, further comprising
providing an index value and de-activating a hit control signal with the CAM array in response to the hashed output value if the hashd output value does not match one of the hashed values stored in the CAM array; and
storing a collision resolution value having a de-activated state and information associated with the new input data value in a random access memory at an address associated with the index value if the hit control signal is de-activated.

* * * * *